United States Patent
Han

(10) Patent No.: US 8,040,152 B1
(45) Date of Patent: Oct. 18, 2011

(54) SEPARATE CONFIGURATION OF I/O CELLS AND LOGIC CORE IN A PROGRAMMABLE LOGIC DEVICE

(75) Inventor: Wei Han, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 12/698,283

(22) Filed: Feb. 2, 2010

(51) Int. Cl.
*H03K 19/173* (2006.01)

(52) U.S. Cl. .......................................... 326/38

(58) Field of Classification Search ............... 326/37–41, 326/47, 101
See application file for complete search history.

(56) References Cited

U.S. PATENT DOCUMENTS

| | | | | |
|---|---|---|---|---|
| 6,071,314 | A * | 6/2000 | Baxter et al. | 716/110 |
| 6,226,779 | B1 * | 5/2001 | Baxter et al. | 326/16 |
| 6,842,039 | B1 * | 1/2005 | Guzman et al. | 326/38 |
| 7,112,992 | B1 * | 9/2006 | Guzman et al. | 326/38 |
| 7,375,549 | B1 * | 5/2008 | Tang et al. | 326/38 |
| 7,538,574 | B1 * | 5/2009 | Tang et al. | 326/38 |

* cited by examiner

*Primary Examiner* — Shawki S Ismail
*Assistant Examiner* — Thienvu Tran
(74) *Attorney, Agent, or Firm* — Haynee and Boone, LLP

(57) ABSTRACT

A programmable logic device (PLD) is provided that includes: a plurality of programmable logic blocks, the plurality of programmable logic blocks being associated with a first configuration data shift register operable to shift in configuration data for the plurality of programmable logic blocks; a plurality of input/output (I/O cells), each I/O cell associating with a corresponding set of I/O configuration memory cells; and a plurality of boundary scan cells corresponding to the plurality of I/O cells, each boundary scan being configurable to form a second data shift register for the I/O configuration memory cells.

12 Claims, 4 Drawing Sheets

SEPARATE CONFIGURATION OF I/O CELLS AND LOGIC CORE IN A PROGRAMMABLE LOGIC DEVICE

TECHNICAL FIELD

The present invention relates generally to electrical circuits and, more particularly, to programmable logic devices and input/output (I/O) cell configuration techniques.

BACKGROUND

Programmable logic devices (PLDs) are programmed with configuration data to provide various user-defined features. For example, a desired functionality may be achieved by programming a configuration memory of a PLD such as a field programmable gate arrays (FPGA) or a complex programmable logic devices (CPLD) with an appropriate configuration data bitstream.

A conventional FPGA includes a data shift register (DSR) to receive the configuration data. Configuration data words are serially shifted into the DSR and then shifted out to configure the appropriate configuration memory cells in the FPGA as determined by an address from a configuration address shift register (ASR). For example, an FPGA typically organizes logic resources such as lookup tables (LUTs) into a plurality of programmable logic blocks. A conventional truth table size for each LUT is sixteen bits. Thus, if each logic block includes four such LUTs, the resulting number of bits necessary to program the configuration memory cells for the truth tables would require 54 bits per programmable logic block. A number of other bits are necessary to complete the programming of a programmable logic block—for example, in one embodiment of an FPGA, each programmable logic block requires 66 configuration memory bits. Thus, a convenient length for the configuration data shift register (DSR) in such an FPGA would match this size so as to be 66 bits long.

But the programmable logic blocks are not the only components in an FPGA that will be configured by configuration data from the configuration DSR. For instance, each input/output (I/O) cell in an FPGA will typically require a certain number of configuration bits to program the I/O cell for the I/O standard being implemented for a given design. Typically, the number of such bits is less than that required for a programmable logic block—for example, in one embodiment, an I/O cell may require 40 bits to complete its configuration. It may thus be seen that a certain number of "phantom" bits will lie in the DSR when a configuration word to configure an I/O cell has been shifted into the DSR. The phantom bits are of course serving no configuration purpose and thus result in undesirable delays.

In addition, the configuration DSR is typically located adjacent the programmable FPGA fabric to be close to the configuration memory cells for this fabric. Routing congestion thus results from the address and data lines that must be directed from the core to the "I/O ring" formed by the plurality of I/O cells. These cells may be considered to form a ring because they associate with the I/O pads that are typically placed circumferentially around the FPGA.

Moreover, the use of the configuration DSR for both the programmable logic block configuration data and the I/O ring configuration data makes the configuration data less repeatable from row-to-row with regard to an external memory providing the configuration data to the PLD being programmed. But it is repeatability that provides the redundancy that can be exploited by configuration data compression schemes. Thus, the external memory must be larger than it would be if the DSR did not have to serve both the core and the I/O ring.

To address these issues in the prior art, FPGAs that provide a separate DSR for the I/O ring have been developed such as disclosed in U.S. Pat. No. 6,842,039. But this separate I/O ring DSR introduces die complexity and cost. Accordingly, there is a need in the art for an improved PLD architecture that addresses the competing configuration needs of the core and the I/O ring.

SUMMARY

In accordance with one embodiment of the present invention, a programmable logic device (PLD) is provided, comprising: a plurality of programmable logic blocks, the plurality of programmable logic blocks being associated with a first configuration data shift register operable to shift in configuration data for the plurality of programmable logic blocks; a plurality of input/output (I/O cells), each I/O cell associating with a corresponding set of I/O configuration memory cells; and a plurality of boundary scan cells corresponding to the plurality of I/O cells, the boundary scan cells being configurable to form a second configuration data shift register for the I/O configuration memory cells.

In accordance with another embodiment of the present invention, a boundary scan cell modified for inclusion within an I/O ring configuration shift register is provided, comprising: a data register clocked by a boundary scan clock signal to receive a configuration memory bit; an update register triggered to latch a data signal from the data register responsive to a processing of a boundary scan update DR signal and a configuration mode signal such that the update register is not clocked by the update DR signal during a configuration mode, and wherein the data signal from the data register is coupled to a corresponding I/O ring configuration memory cell during the configuration mode.

In accordance with another embodiment of the present invention, a method of configuring a PLD is provided, comprising: serially shifting configuration data into a first data shift register to provide configuration data for a programmable core for the PLD; and serially shifting configuration data into a plurality of boundary scan cells for the PLD to provide configuration data for a plurality of I/O cells for the PLD.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

Embodiments of the present invention and their advantages are best understood by referring to the detailed description

DETAILED DESCRIPTION

To provide an improved PLD configuration architecture, boundary scan cells in a PLD such as the Joint Test Action Group (JTAG) boundary scan cells are modified to form an I/O ring data shift register (DSR). In this fashion, the problems for the prior art approaches of using a single DSR for both the core and the I/O ring are avoided. As specified in the IEEE 1149 standard, a JTAG boundary scan cell associates with each input/output pin (or pad) of a JTAG-enabled device. The boundary scan cells form a serial chain that couples to a JTAG input/output port for a device. A user may test a JTAG device by shifting in a vector through the I/O JTAG port, which is typically denoted as the JTAG standard access port. Because of the prevalence and desirability of the JTAG boundary scan cells in the integrated circuit arts, PLDs such as FPGAs include a boundary scan cell with each I/O pin. Thus, each I/O cell also includes a JTAG boundary scan cell.

As known in the integrated circuit arts, the JTAG access port is typically used to shift in test vectors and shift out results to verify a given chip's performance. But the FPGA industry has exploited the JTAG access port to also provide the configuration data to the configuration DSR. This bypass of the boundary scan cells is achieved through a JTAG controller that controls the state of the JTAG port and the I/O cells. Ordinarily, during a JTAG "shift DR" operation, input data entering the JTAG access port is serially shifted through the boundary scan cells. During configuration of the FPGA, the controller simply prevents the configuration data being shifted into the JTAG I/O port from entering this serial chain of boundary scan cells and instead shunts the incoming data on the JTAG access port to the configuration DSR.

As discussed further herein, the present invention exploits the JTAG boundary scan cells such that a bifurcation occurs at the JTAG access port with respect to the configuration data for the core as opposed to the I/O ring. The configuration data for the core can continue to pass through the JTAG access port to the core's configuration DSR. In other words, the configuration DSR that in the prior art would service both the core and the I/O ring will now provide configuration data just for the core. The JTAG boundary scan cells are modified so that they form an I/O ring configuration DSR. This modification is advantageous since the boundary scan cells are already configured to form a DSR. Thus, the JTAG controller directs the configuration data received at JTAG access port to either the core configuration DSR or the I/O ring (boundary scan cell) configuration DSR depending upon what type of configuration data is being received by the FPGA.

Figure 1:
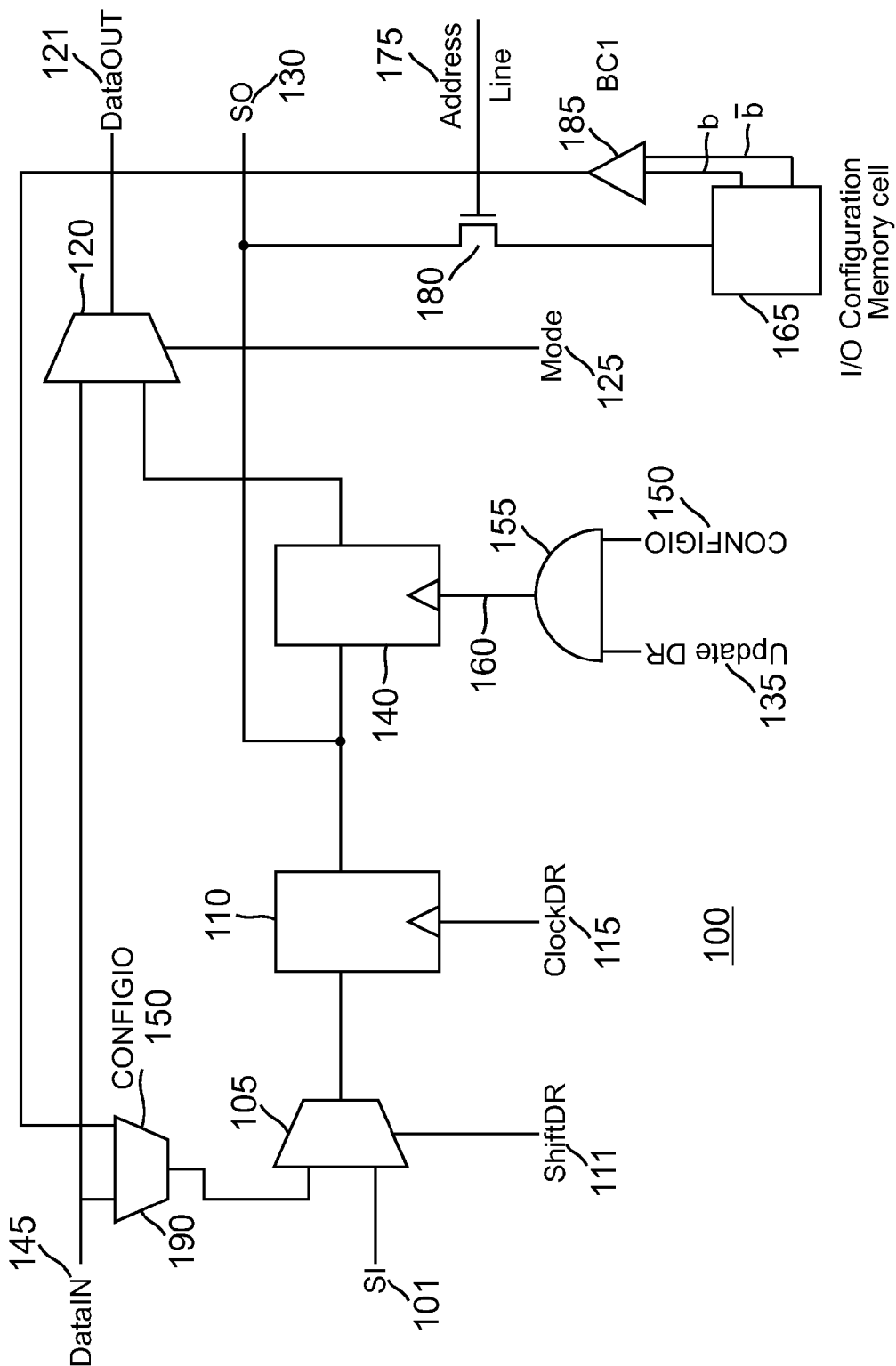
FIG. 1 is a circuit diagram for a BC1 boundary scan cell modified according to an embodiment of the invention.

The modification to the boundary scan cell may be better understood with reference to FIG. 1, which shows a two-register boundary scan cell 100. In general, an FPGA's existing boundary scan cell will have four registers to enable the tri-stating of the I/O pins. However, discussion of the inventive modification with respect to two-register boundary scan cell 100 provides an easier conceptual appreciation of such a modification. Boundary scan cell 100 is classified as "BC1" cell in the JTAG protocol.

Figure 2:
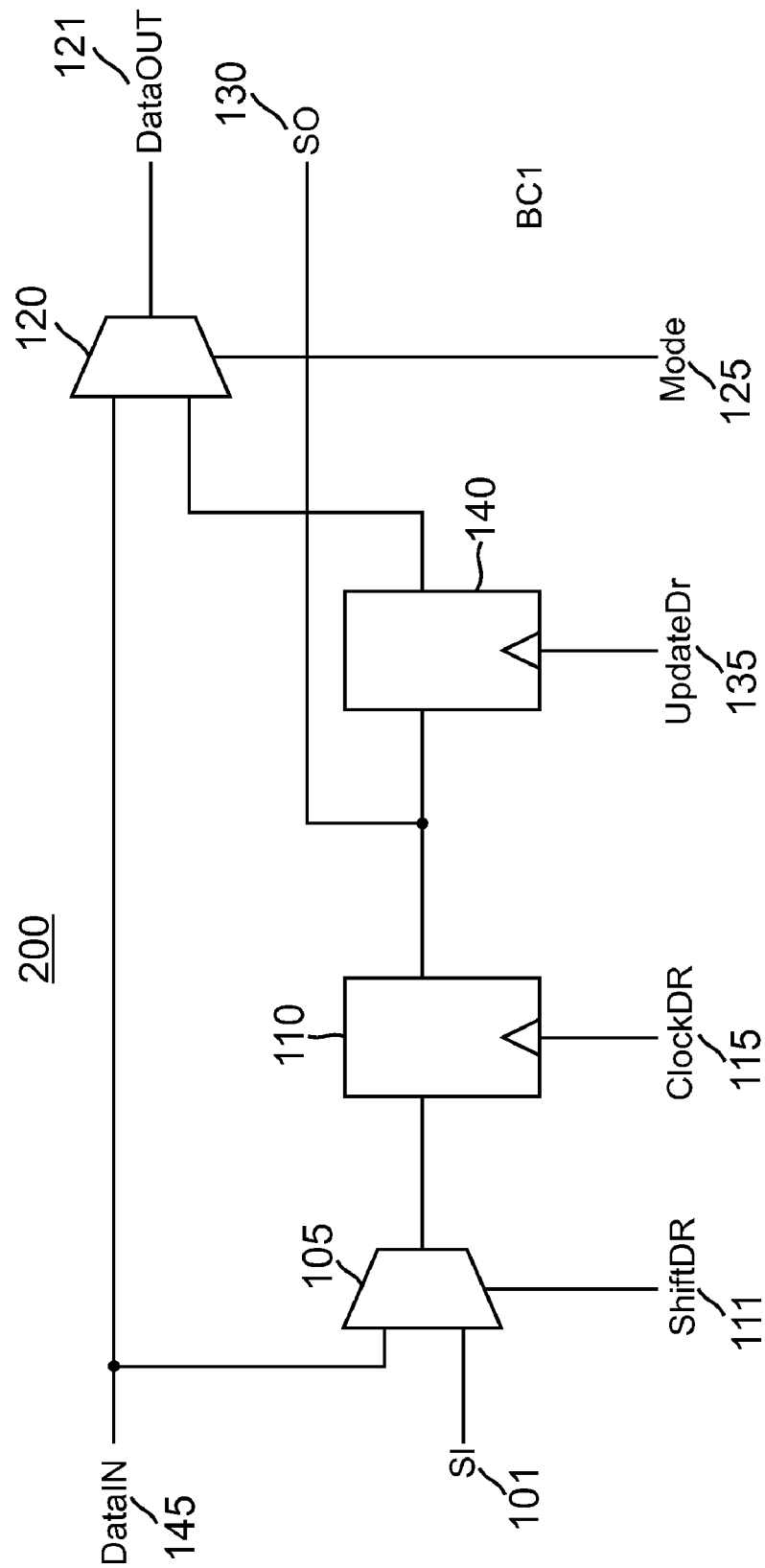
FIG. 2 is a circuit diagram for a conventional BC1 boundary scan cell.

The modifications for cell 100 may be contrasted to the conventional structure for a BC1 cell 200 as shown in FIG. 2. In a serial shift mode, the boundary scan cells form a serial chain or shift register such that a serial in (SI) data signal 101 (which may also be designated as SCANDI) is shifted into the cell as selected by a multiplexer 105 as controlled by a JTAG control signal ShiftDR 110 for cell 200. After being registered in a data register 110 responsive to cycles of a JTAG clock signal (clockDR) 115, a data output signal from data register 110 may be shifted to the next boundary scan cell in the chain as serial out (SO) data signal 130, which may also be designated as SCANDO. If, however, a JTAG update signal UpdateDR 135 is asserted, the data output signal from data register 110 will be latched in an update register 140 in cell 200. A JTAG boundary scan cell also has a parallel-in-parallel-out mode in addition to this serial scan behavior. Thus, a parallel-in data signal DataIn 145 (which may also be designated as DI) can bypass the boundary scan cell registers through a multiplexer 120 as controlled by a JTAG mode signal 125 (which may also be designated as INTEST) to produce a parallel-out signal DataOUT 121. Such parallel or serial operation of boundary scan cell 200 is conventional.

Referring back to FIG. 1, modified boundary scan cell 100 includes all the elements and behavior discussed with regard to cell 200 of FIG. 2. However, for boundary scan cell 100, SI data 101 may also be I/O ring configuration data. In such a configuration mode, it will be appreciated that the I/O ring configuration data is shifted into the FPGA at the Test Data In (TDI) pin of the JTAG access port as is conventional for FPGA configuration. However, unlike a conventional FPGA configuration, the JTAG controller does not shunt the configuration data into a single (common to both core and I/O) configuration DSR. Instead, the boundary scan data registers 110 form the I/O ring configuration DSR. As previously noted, each FPGA I/O cell includes a JTAG boundary scan cell as known in the art. Thus, during configuration the I/O configuration data is successively passed from I/O cell to I/O cell through the I/O configuration DSR formed by boundary scan data registers 110. For example, if there are 10 I/O cells each including a JTAG boundary scan cell 100, then 10 configuration bits would be serially shifted through the I/O cells to fill the DSR formed by the resulting ten data registers 110. Having filled the DSR, address lines would be asserted as discussed further herein to latch the data in the I/O ring configuration DSR into the corresponding configuration memory cells.

To prevent the I/O ring configuration data from getting latched erroneously into each update register 140, register 140 in boundary scan cell 100 is not triggered directly by UpdataDR 135 as is conventionally performed as discussed with regard to boundary scan cell 200. Instead, an active-low I/O ring configuration signal CONFIGIO 150 may be processed with UpdateDR 135 in an AND gate 155 to produce a latch trigger signal 160. CONFIGIO 150 may be controlled by the JTAG controller or another suitable controller to be asserted active low during the configuration mode. Thus, configuration data stored in data register 110 is prevented from getting latched in update register 140. This is desirable since update register 140 is used to drive the state of an output pin associated with the boundary scan cell during JTAG test modes. Without any blocking of the triggering of update register 140, the output pin could thus get polluted by the I/O ring configuration data.

In the configuration mode, the serial output SO signal (which is now configuration data) 130 is provided to a corresponding I/O ring configuration memory cell 165 through selection by a configuration address line 175. In that regard, suppose each I/O cell required sixteen configuration bits. There would thus be sixteen different configuration memory cells such as memory cell 165 that could receive configuration data 130. For illustration clarity, only one configuration memory cell and its corresponding address line are shown in FIG. 1. The appropriate one of the address lines could thus be selected for by a counter. Returning again to the example of ten I/O cells such that configuration data is shifted in one 10-bit word at a time—the first configuration word is shifted in such that data register 110 stores a bit from this word. This data bit may then latched into a first one of the sixteen configuration memory cells 165 through selection of a first one of the address lines 175 responsive to the counter. A second configuration data word is then shifted into the I/O configuration DSR formed by data registers 110, the counter shifted as well to select a second address line to thereby load a second one of the configuration memory cells, and so on to fill the sixteen configuration memory cells for each I/O cell. Each address line 175 would couple to a switch such as a transistor 180 that couples between data register 110 and the respective I/O ring configuration memory cell 160.

A configuration memory cell such as memory cell 165 is often formed as a static random access memory (SRAM) cell that thus stores a true (b) and a complement ($\bar{b}$) value. To read the contents of the configuration memory cell so as to verify a correct storage of the appropriate configuration data bit, a sense amplifier 185 determines the value of the bit stored in memory cell 165 and provides the resulting data signal as an input to a multiplexer 190 accordingly. Multiplexer 190, responsive to CONFIGIO 150, selects for either dataIN 145 or the configuration data bit sensed by sense amplifier 185 to provide an input to multiplexer 105. Multiplexer 105 is controlled by a JTAG Shift DR signal 111 to either select for SI 101 or the output from multiplexer 190. In this fashion, during a read mode the sensed bit from memory cell 165 may be latched into data register 110 and serially-shifted out as signal SO 130.

Figure 3:
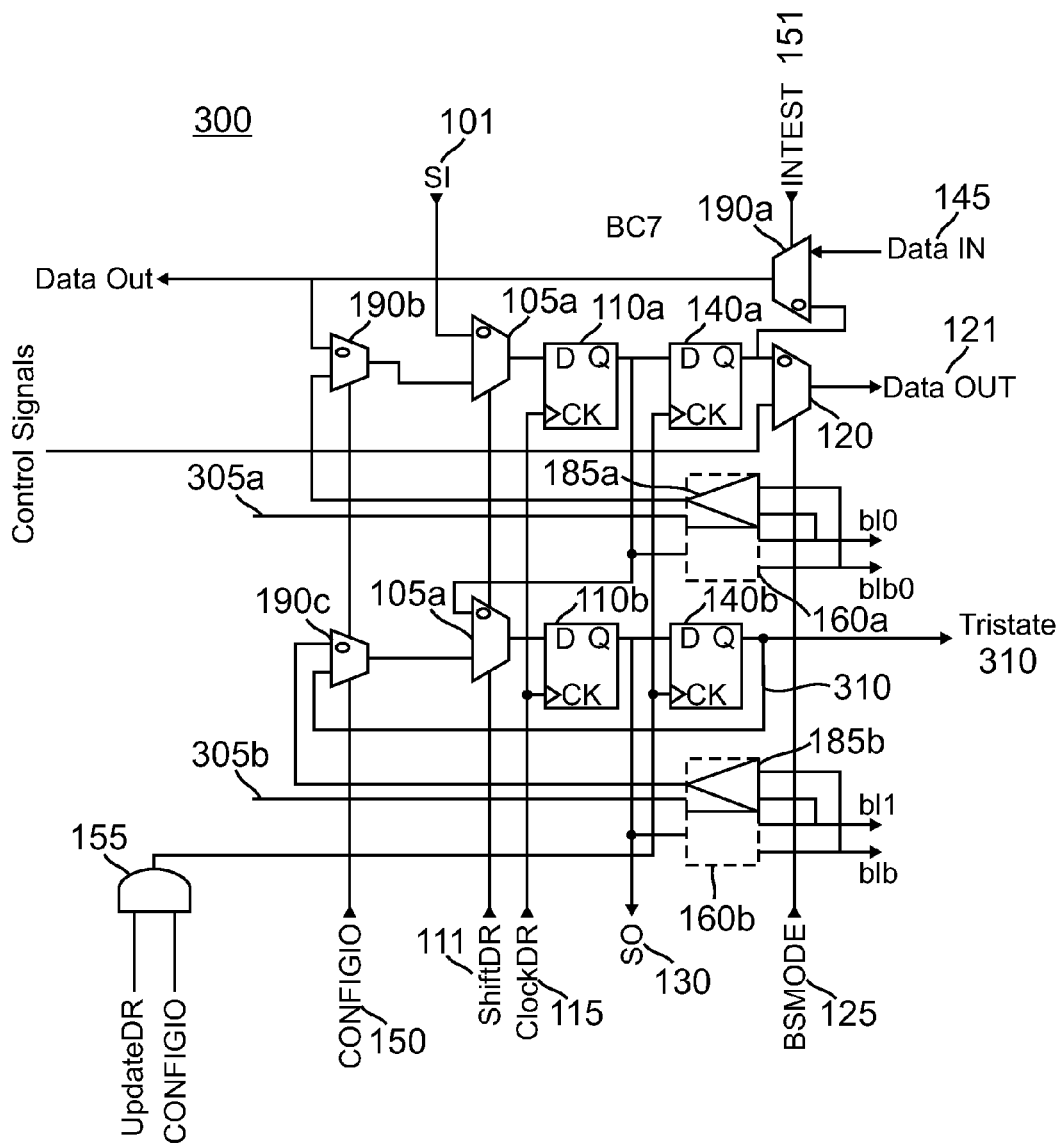
FIG. 3 is a circuit diagram for a BC7 boundary scan cell modified according to an embodiment of the invention.

FIG. 3 shows a modified four-register boundary scan cell 300. As noted previously, it is conventional to associate each I/O cell of an FPGA with a four-register BC7 boundary scan cell that includes two data registers. The extra data register is desirable for a tri-stating of the input or output pin controlled by the BC7 boundary scan cell's I/O cell. Modified BC7 boundary scan cell 300 may be used to form part of an I/O configuration DSR in an analogous fashion as discussed with regard to boundary scan cell 100. BC7 boundary scan cell includes a first data register 110a and a second data register 110b as compared to the single register 110 in boundary scan cell 100. Similarly, BC7 boundary scan cell 300 includes a first update register 140a and a second update register 140b as compared to the single register 140 of FIG. 1. AND gate 155 acts as discussed with regard to FIG. 1 to block the triggering of update registers 140a and 140b.

One can thus appreciate that a configuration mode operation of BC7 boundary scan cell 300 is analogous to that for boundary scan cell 100 except that two configuration memory bits are shifted in as signal SI 101 to fill data registers 110a and 110b responsive to two cycles of JTAG clock 115. For illustration clarity, no address lines or corresponding switches such as line 175 and FET 180 are shown for BC7 boundary scan cell 300. Thus, data register 110a is shown having its data output connected to a corresponding configuration memory cell 160a whereas data register 110b has its data output connected to a corresponding configuration memory cell 160b. To read back the contents of these configuration memory cells, corresponding sense amplifiers 185a and 185b act analogously as discussed with regard to sense amplifier 185 of FIG. 1. Control signal 305a and 305b control the activation of respective sense amplifiers 185a and 185b. However, a single multiplexer 190 as discussed with regard to FIG. 1 is not appropriate for BC7 boundary scan cell 300 since its function is analogously performed by multiplexers 190a, 190b, and 190c. Multiplexer 190a is controlled by a control signal INTEST 151 to select for either an output signal from update register 141a or parallel-in data signal DataIn 145 to provide an input signal to multiplexer 190b. Multiplexer 190b selects between the output from multiplexer 190a or the sensed configuration data bit from sense amplifier 185a responsive to CONFIGIO 150. Multiplexer 190c, also responsive to CONFIGIO 150, selects between a tristate output signal 310 from update register 140b or a sensed configuration bit from sense amplifier 185b. In this fashion, the sensed configuration bits may be shifted out as signal SO 130 as discussed with regard to BC1 boundary scan cell 100 of FIG. 1.

Figure 4:
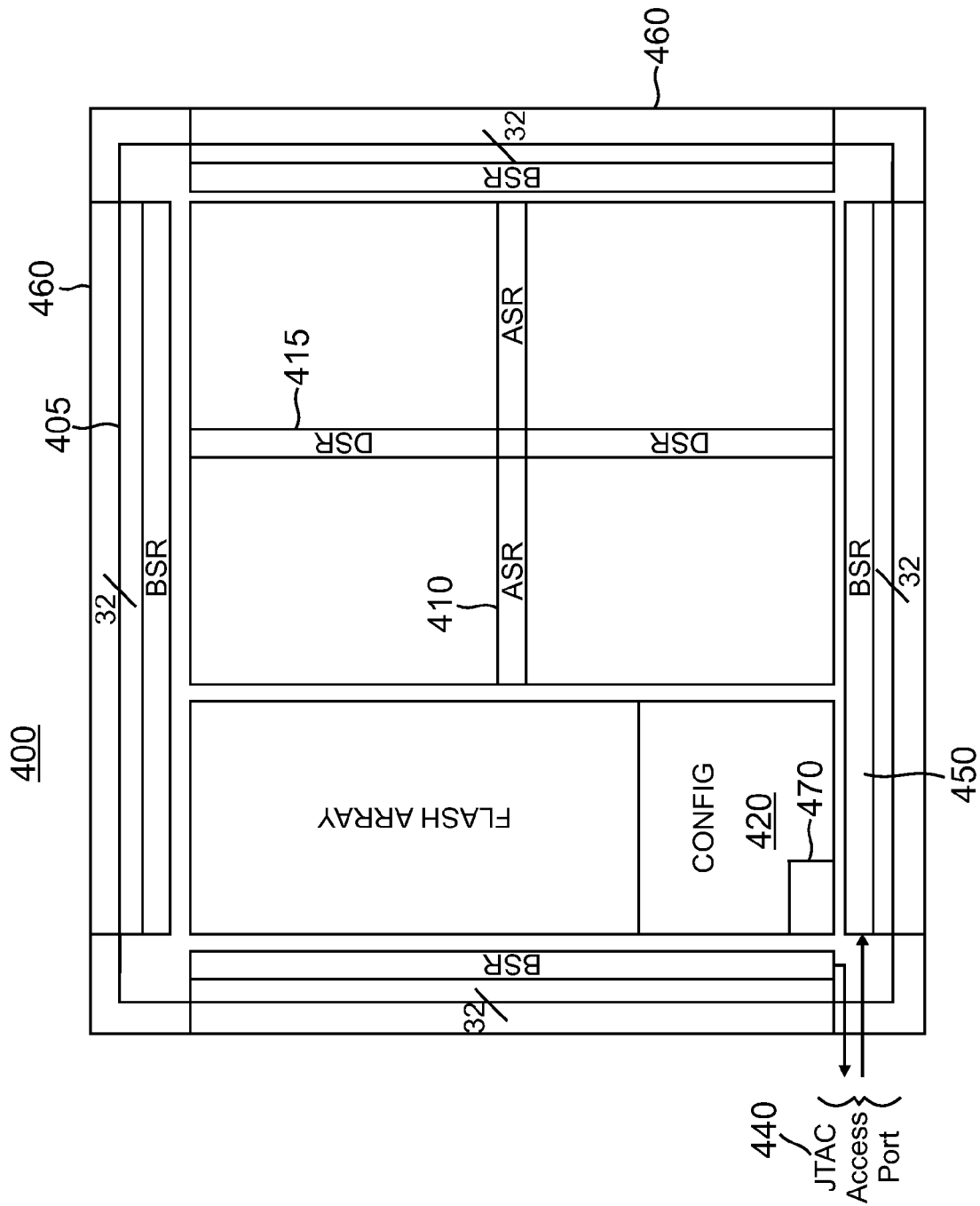
FIG. 4 shows an FPGA incorporating a JTAG boundary scan chain modified to act as a configuration DSR for the I/O ring.

An FPGA 400 including a boundary scan chain formed from cells such as JTAG boundary scan cells 300 or 100 is illustrated in FIG. 4. As discussed with regard to FIG. 1, each I/O ring configuration memory cell may receive its configuration memory bit through selection by a corresponding address line. Suppose that each I/O cell requires sixteen configuration memory bits to complete its configuration. Should a one-configuration-bit-shifting boundary scan cell such as a BC1 100 be used, there would thus need to be sixteen address lines in such an embodiment. However, if a two-configuration-bit-shifting boundary scan cell such as BC7 cell 300 be used, there would only need to be eight address lines in such an alternative embodiment. In general, it may thus be seen that the number of address lines required will vary depending upon the boundary scan type and the number of configuration bits required for each I/O cell. As illustrated, FPGA 400 includes thirty-two address lines 405 although it will be appreciated that such a number of address lines is a design variable. I/O configuration memory cells 460 (illustrated collectively with the corresponding I/O cells) receive their configuration data according to the address carried on address lines 405. As discussed previously, the boundary scan cells for the I/O cells are modified to form an I/O configuration boundary scan shift register (BSR) 450 to provide the I/O configuration data to the I/O configuration memory cells. A core address shift register 410 and a core configuration data shift register 415 operate in the conventional fashion to configure a configuration memory 420. The configuration data may also be stored in a non-volatile fashion in a FLASH array 430.

Configuration data for FPGA 400 enters JTAG access port 440. If the configuration data is destined for configuration memory 420, a JTAG controller 470 shunts the configuration data to core configuration data shift register 415. Conversely, if the configuration data is destined for I/O configuration memory 460, JTAG controller 470 shunts the configuration data to I/O ring data shift register 450. In this fashion, I/O cells 460 may be configured without the phantom bit problem and routing issues if DSR 415 were used for both I/O ring and core configuration.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device (PLD), comprising:
   a plurality of programmable logic blocks, the plurality of programmable logic blocks being associated with a first configuration data shift register operable to shift in configuration data for the plurality of programmable logic blocks;
   a plurality of input/output (I/O cells), each I/O cell associating with a corresponding set of I/O configuration memory cells;

a plurality of boundary scan cells corresponding to the plurality of I/O cells, the boundary scan cells being configurable to form a second configuration data shift register for the I/O configuration memory cells;

a plurality of switches between each I/O cell's boundary scan cell and the associated I/O configuration memory cells; and a plurality of address lines coupled to the plurality of switches.

2. The PLD of claim 1, wherein each boundary scan cell includes a JTAG BC7 cell.

3. The PLD of claim 1, wherein each boundary scan cell includes a JTAG BC1 cell.

4. The PLD of claim 1, wherein the PLD comprises a field programmable gate array (FPGA).

5. The PLD of claim 1, wherein the switches comprise field effect transistors (FETs).

6. The PLD of claim 1, wherein the configuration memory cells comprise SRAM cells, the PLD further comprising:

a plurality of sense amplifiers for sensing the plurality of SRAM cells.

7. A programmable logic device (PLD), comprising:

a plurality of programmable logic blocks, the plurality of programmable logic blocks being associated with a first configuration data shift register operable to shift in configuration data for the plurality of programmable logic blocks;

a plurality of input/output (I/O cells), each I/O cell associating with a corresponding set of I/O configuration memory cells; and a plurality of boundary scan cells corresponding to the plurality of I/O cells, the boundary scan cells being configurable to form a second configuration data shift register for the I/O configuration memory cells, wherein each boundary scan cell includes:

a data register clocked by a clock DR signal so as to store a bit from the configuration data; and an update register triggered to store a data signal from the data register responsive to a processing of a boundary scan updateDR signal and a configuration mode signal such that the update register is not triggered to store the data signal during a configuration mode, and wherein the data signal is coupled to a corresponding I/O ring configuration memory cell during the configuration mode.

8. The PLD of claim 7, wherein each boundary scan cell further includes an AND gate to process the boundary scan updateDR signal and the configuration mode signal.

9. A programmable logic device (PLD), comprising:

a plurality of input/output (I/O cells), each I/O cell associated with a corresponding set of I/O configuration memory cells;

a plurality of boundary scan cells corresponding to the plurality of I/O cells, each boundary scan cell including a data register;

a plurality of switches coupled between the data registers of the boundary scan cells and the associated I/O configuration memory cells; and a plurality of address lines coupled to the plurality of switches, wherein the boundary scan cells are configurable to form a configuration data shift register for shifting configuration data into the I/O configuration memory cells from the data registers of the boundary scan cells in response to address signals on the address lines coupled to the switches.

10. The PLD of claim 9, wherein the switches comprise field effect transistors (FETs).

11. The PLD of claim 9, wherein the configuration memory cells comprise SRAM cells, the PLD including a plurality of sense amplifiers for sensing the plurality of SRAM cells.

12. The PLD of claim 9, wherein the PLD comprises a field programmable gate array (FPGA).

* * * * *